(12) United States Patent
Guo et al.

(10) Patent No.: US 8,952,431 B2
(45) Date of Patent: Feb. 10, 2015

(54) STACKED CARBON-BASED FETS

(71) Applicant: International Business Machines Corporation, Armonk, NY (US)

(72) Inventors: Dechao Guo, Fishkill, NY (US); Shu-Jen Han, Cortlandt Manor, NY (US); Yu Lu, Hopewell Junction, NY (US); Keith Kwong Hon Wong, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/890,849

(22) Filed: May 9, 2013

(65) Prior Publication Data

US 2014/0332860 A1 Nov. 13, 2014

(51) Int. Cl.
*H01L 29/66* (2006.01)
*H01L 29/78* (2006.01)
*H01L 29/786* (2006.01)

(52) U.S. Cl.
CPC ............ *H01L 29/6656* (2013.01); *H01L 29/78* (2013.01); *H01L 29/78642* (2013.01); *H01L 29/78645* (2013.01)
USPC ...................................................... 257/288

(58) Field of Classification Search
CPC ................. H01L 29/1606; H01L 29/78; H01L 29/66431; H01L 29/49; H01L 29/517; H01L 29/7881; H01L 29/792; H01L 29/772; H01L 27/285; H01L 27/11; H01L 27/1104; H01L 27/088; H01L 27/092; H01L 21/2007; H01L 21/8258; H01L 27/0688; H01L 29/78684; H01L 29/78642; H01L 29/78643; H01L 29/4908; H01L 29/66742; H01L 29/78696; H01L 29/78648; H01L 29/41783; H01L 29/66575; G11C 2213/17; G11C 2213/56; G11C 2213/35; G11C 13/025
USPC ........... 257/E21.421, E29.137, 366; 438/151, 438/157, 585
See application file for complete search history.

(56) References Cited

U.S. PATENT DOCUMENTS

| | | | |
|---|---|---|---|
| 6,818,487 B2 | 11/2004 | Hsu et al. | |
| 7,018,873 B2 | 3/2006 | Dennard et al. | |
| 7,141,476 B2 | 11/2006 | Dao | |
| 7,974,524 B2 * | 7/2011 | Yamazaki et al. | 392/407 |
| 7,982,221 B2 | 7/2011 | Han et al. | |
| 8,124,463 B2 | 2/2012 | Chen et al. | |
| 8,288,759 B2 | 10/2012 | Chen et al. | |
| 8,513,673 B2 * | 8/2013 | Wada et al. | 257/77 |
| 8,790,994 B2 * | 7/2014 | Dairiki et al. | 438/458 |

(Continued)

OTHER PUBLICATIONS

Non-Final Office Action issued in U.S. Appl. No. 13/968,101 on May 1, 2014. (15 Pages).

(Continued)

*Primary Examiner* — Zandra Smith
*Assistant Examiner* — Sophia Nguyen
(74) *Attorney, Agent, or Firm* — Tutunjian & Bitetto, P.C.; Vazken Alexanian

(57) ABSTRACT

Methods and systems for forming stacked transistors. Such methods include forming a lower channel layer on a substrate; forming a pair of vertically aligned gate regions over the lower channel layer; forming a pair of vertically aligned source regions and a pair of vertically aligned drain regions on the lower channel material, each pair separated by an insulator; forming an upper channel material over the source regions, drain regions, and gate regions; and providing electrical access to the source, drain, and gate regions.

20 Claims, 5 Drawing Sheets

(56) References Cited

U.S. PATENT DOCUMENTS

| | | |
|---|---|---|
| 2004/0245577 A1 | 12/2004 | Bhattacharyya |
| 2005/0239241 A1 | 10/2005 | Ouyang et al. |
| 2005/0286287 A1 | 12/2005 | Park et al. |
| 2007/0176230 A1* | 8/2007 | Uchida et al. ............ 257/328 |
| 2008/0128780 A1* | 6/2008 | Nishihara et al. .......... 257/316 |
| 2008/0157354 A1 | 7/2008 | Zhang et al. |
| 2008/0272361 A1 | 11/2008 | Lim |
| 2009/0169919 A1* | 7/2009 | Garcia et al. ............ 428/688 |
| 2009/0174003 A1* | 7/2009 | Chang et al. ............ 257/369 |
| 2009/0236675 A1 | 9/2009 | Yang et al. |
| 2009/0250772 A1 | 10/2009 | Botula et al. |
| 2009/0286351 A1 | 11/2009 | Hirao et al. |
| 2010/0213435 A1* | 8/2010 | Fujii et al. ............ 257/9 |
| 2011/0114919 A1* | 5/2011 | Jenkins et al. ........... 257/29 |
| 2011/0227044 A1* | 9/2011 | Kawanaka et al. ........ 257/29 |
| 2011/0315961 A1* | 12/2011 | Chen et al. ............ 257/29 |
| 2012/0146001 A1* | 6/2012 | Chen et al. ............ 257/29 |
| 2012/0175594 A1 | 7/2012 | Chen et al. |
| 2012/0181510 A1 | 7/2012 | Avouris et al. |
| 2012/0205735 A1 | 8/2012 | Yasuda et al. |
| 2012/0224413 A1* | 9/2012 | Zhang et al. ............ 365/148 |
| 2012/0235118 A1* | 9/2012 | Avouris et al. ............ 257/27 |
| 2012/0248544 A1 | 10/2012 | Yokoyama |
| 2012/0292602 A1 | 11/2012 | Guo et al. |
| 2012/0305893 A1 | 12/2012 | Colinge |
| 2013/0069665 A1 | 3/2013 | Jaramillo-Botero et al. |
| 2013/0075685 A1* | 3/2013 | Li et al. ............ 257/3 |
| 2013/0082235 A1* | 4/2013 | Gu et al. ............ 257/9 |
| 2014/0021446 A1* | 1/2014 | Lee et al. ............ 257/29 |
| 2014/0077312 A1 | 3/2014 | Thompson et al. |
| 2014/0145269 A1* | 5/2014 | Xiao et al. ............ 257/366 |

OTHER PUBLICATIONS

Batude, P., et al. "3-D Sequential Integration: A Key Enabling Technology for Heterogeneous Co-Integration of New Function With CMOS" IEEE Journal on Emerging and Selected Topics in Circuits and Systems, vol. 2, No. 4. Dec. 2012. pp. 714-722.

Franklin, A.D., et al. "Transistors From Vertical Stacking of Carbon Nanotube Thin Films" U.S. Appl. No. 13/679,613, filed Nov. 16, 2012. (24 Pages).

Farmer, D.B., et al. "Vertical Stacking of Graphene in a Field-Effect Transistor" U.S. Appl. No. 13/683,148, filed Nov. 21, 2012. (22 Pages).

* cited by examiner

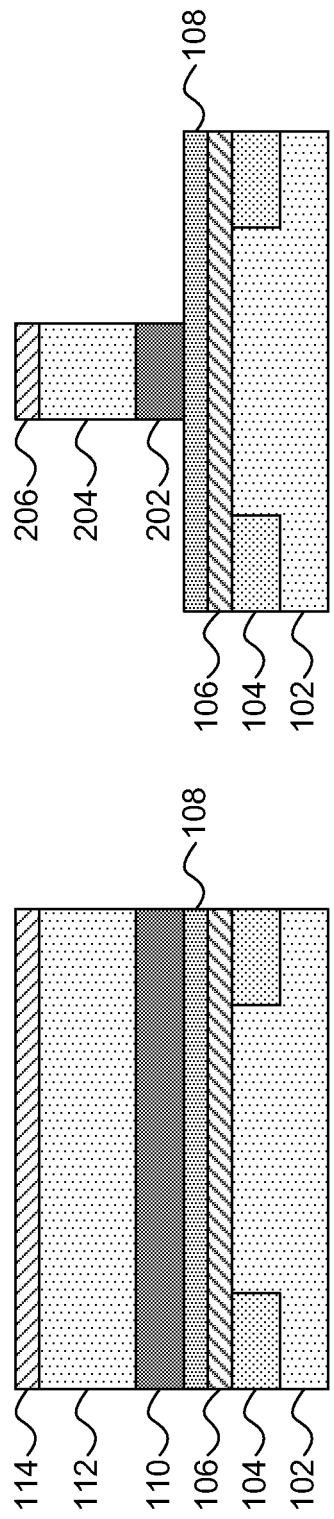
FIG. 1
FIG. 2
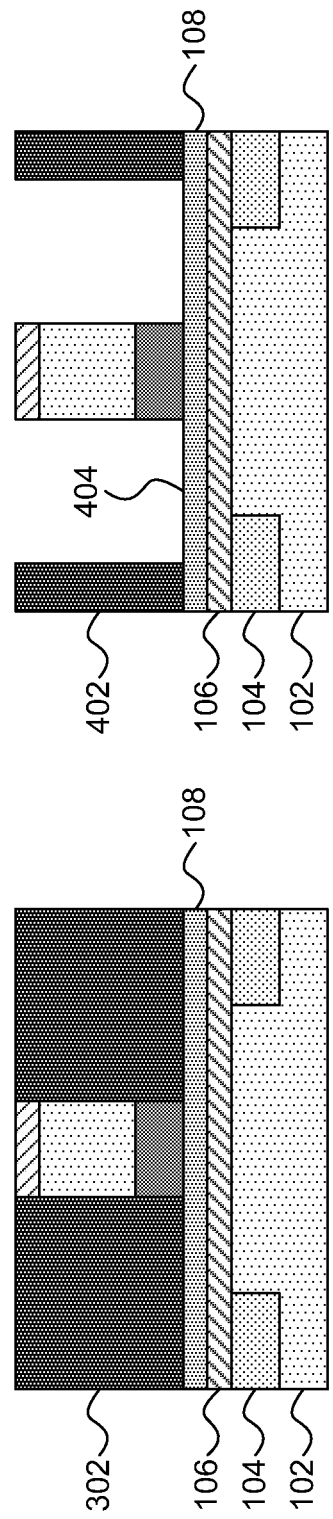
FIG. 3
FIG. 4

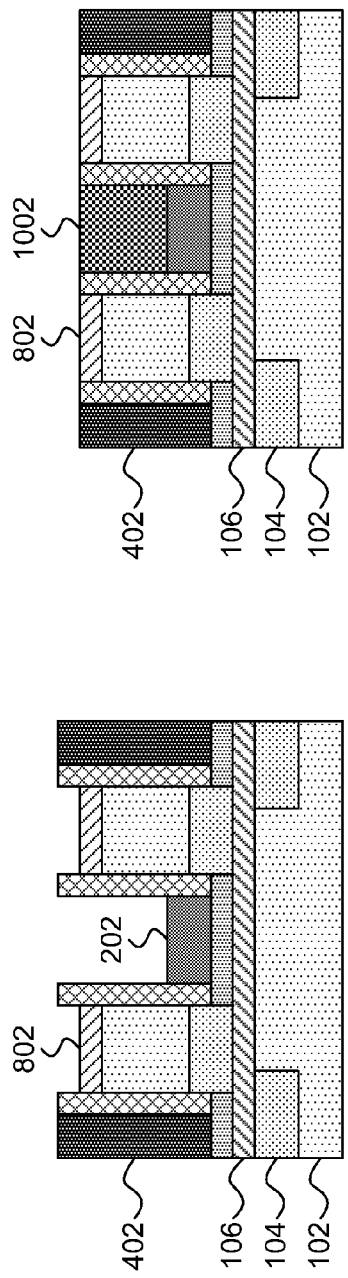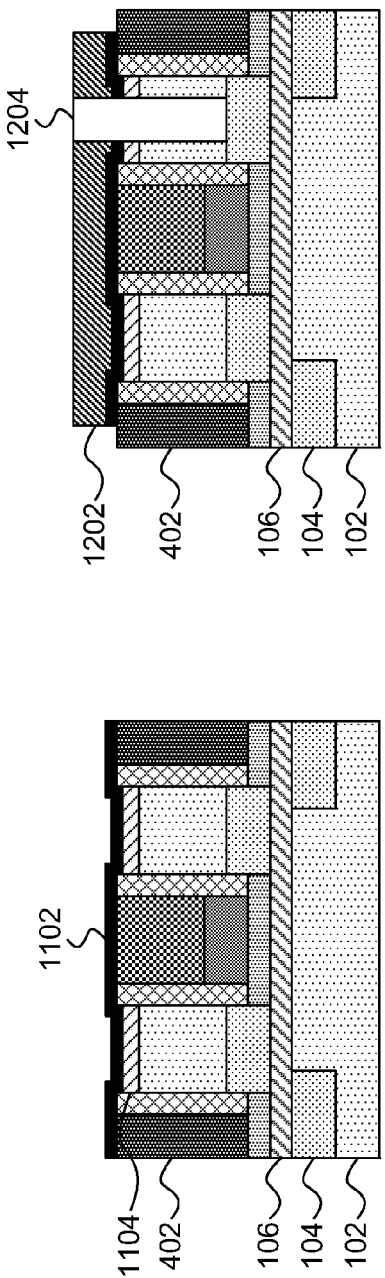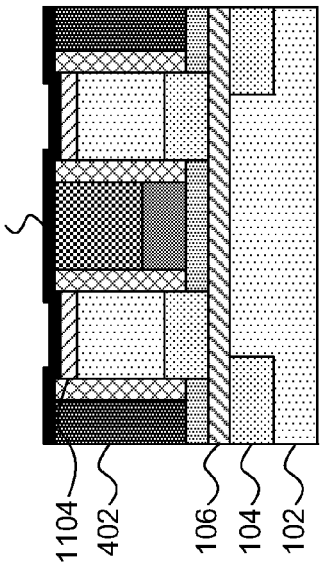

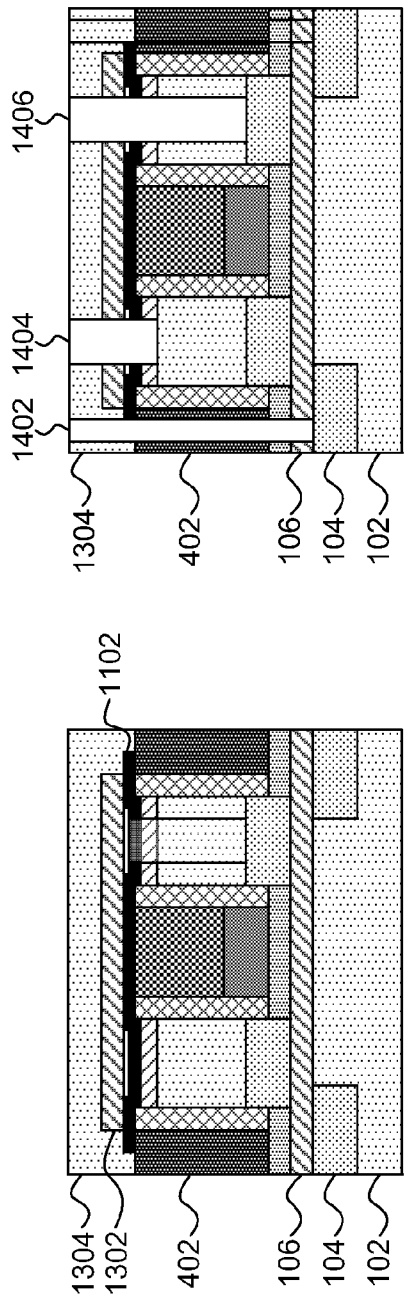
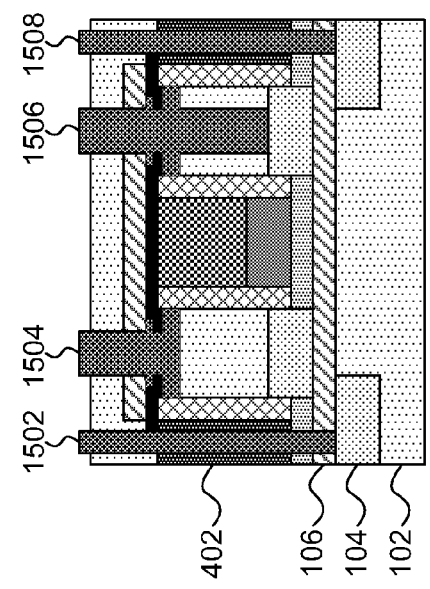
FIG. 13
FIG. 14
FIG. 15

US 8,952,431 B2

STACKED CARBON-BASED FETS

BACKGROUND

1. Technical Field

The present invention relates to transistors and, more particularly, to stacked carbon-based field effect transistors.

2. Description of the Related Art

Carbon-based metal oxide semiconductor field effect transistors (MOSFETs) do not need single-crystal substrates that are common in conventional metal oxide semiconductor technologies. This opens up the possibility of stacking multiple layers of such devices, thereby increasing circuit density. However, simply repeating layers of carbon transistor devices at advanced technology nodes calls for very stringent overlay and device matching. Interconnects between layers add significant delay and greatly increase layout complexity.

SUMMARY

A method for forming stacked transistors includes forming a lower channel layer on a substrate; forming a pair of vertically aligned gate regions over the lower channel layer; forming a pair of vertically aligned source regions and a pair of vertically aligned drain regions on the lower channel material, each pair separated by an insulator; forming an upper channel material over the source regions, drain regions, and gate regions; and providing electrical access to the source, drain, and gate regions.

A method for forming stacked transistors includes forming a lower carbon-based channel layer on a substrate; forming a lower gate dielectric layer on the lower channel layer; forming a pair of vertically aligned gate regions on the lower gate dielectric layer; forming a pair of vertically aligned source regions and a pair of vertically aligned drain regions on the lower channel material, each pair separated by an insulator; forming an upper gate dielectric over the source regions, drain regions, and gate regions; forming an upper carbon-based channel material on the upper gate dielectric; and providing electrical access to the source, drain, and gate regions, including forming an electrical connection between at least two of the upper and lower source and drain regions.

A stacked transistor device includes a lower channel layer formed on a substrate; a pair of vertically aligned source regions formed over the lower channel layer, said pair of source regions being separated by an insulator; a pair of vertically aligned drain regions formed on the lower channel layer, said pair of drain regions being separated by an insulator; a pair of vertically aligned gate regions formed on the lower gate dielectric layer; and an upper channel layer formed over the source regions, drain regions, and gate regions.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 1 is a cross-sectional view of a step in the formation of a stacked gate transistor in accordance with the present principles;

FIG. 2 is a cross-sectional view of a step in the formation of a stacked gate transistor in accordance with the present principles;

FIG. 3 is a cross-sectional view of a step in the formation of a stacked gate transistor in accordance with the present principles;

FIG. 4 is a cross-sectional view of a step in the formation of a stacked gate transistor in accordance with the present principles;

FIG. 9 is a cross-sectional view of a step in the formation of a stacked gate transistor in accordance with the present principles;

FIG. 10 is a cross-sectional view of a step in the formation of a stacked gate transistor in accordance with the present principles;

FIG. 11 is a cross-sectional view of a step in the formation of a stacked gate transistor in accordance with the present principles;

FIG. 12 is a cross-sectional view of a step in the formation of a stacked gate transistor in accordance with the present principles;

FIG. 13 is a cross-sectional view of a step in the formation of a stacked gate transistor in accordance with the present principles;

FIG. 14 is a cross-sectional view of a step in the formation of a stacked gate transistor in accordance with the present principles;

FIG. 15 is a cross-sectional view of a step in the formation of a stacked gate transistor in accordance with the present principles.

DETAILED DESCRIPTION OF PREFERRED EMBODIMENTS

Figure 5:
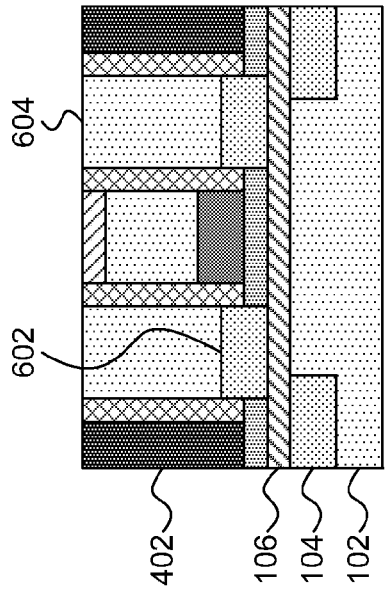
FIG. 5 is a cross-sectional view of a step in the formation of a stacked gate transistor in accordance with the present principles.

The present principles provide self-aligned, stacked carbon-based metal oxide semiconductor field effect transistors (MOSFETs). According to the present principles, a carbon-based MOSFET can be stacked on another carbon-based FET or a conventional FET and may have opposite polarity. So, for example, a p-type FET may be stacked on an n-type FET and the reverse is also true. This structure lends itself well to several circuit elements, such as inverters, NAND gates, XOR gates, multiplexers, memory cells, etc.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a step in forming stacked carbon-based FETs is shown. A substrate 102 is formed from any appropriate material. For example, the substrate 102 may be formed from a dielectric such as silicon dioxide. Source/drain extensions 104 are formed in the substrate 102. The source/drain extensions 104 do not represent the functional source/drain regions themselves, but are instead conductive elements that will provide electrical communication with the source/drain regions. As such, the source/drain regions may be formed from any suitable material including, e.g., a conductor metal such as tungsten or a conductive composite. A carbon-based channel layer 106 is formed over the surface of substrate 102, with a gate dielectric layer 108 above the carbon layer 106. The carbon layer 106 may be formed from any suitable carbon-based channel material including, e.g., carbon nanotubes and graphene. The gate dielectric layer 108 may be formed from any appropriate dielectric material including, e.g., a high-k dielectric such as hafnium silicate, hafnium dioxide, zirconium silicate, and zirconium dioxide.

A layer of gate material 110 is formed on the dielectric layer 108. The gate material 110 may be, for example, a metal, such as tantalum, tantalum nitride, or niobium, or may be a non-metallic gate material such as polysilicon. A capping dielectric layer 112 is formed on the gate material layer 110. The capping dielectric layer 112 may be formed from any appropriate dielectric including, e.g., silicon dioxide. A top layer 114 is formed over the capping dielectric layer 112 and may be formed from, e.g., amorphous silicon.

Referring now to FIG. 2, a step in forming stacked carbon-based FETs is shown. An anisotropic etch is performed on the gate material layer 110, the capping dielectric layer 112, and the top layer 114 to form a gate stack made up of a gate 202, a dielectric cap 204, and a top 206 of, e.g., amorphous silicon. It is contemplated that those having ordinary skill in the art will be able to select an appropriate etch that stops on the gate dielectric layer 108. In one embodiment, a reverse ion etch (RIE) process is used to form the gate stack.

Referring now to FIG. 3, a step in forming stacked carbon-based FETs is shown. A hardmask layer 302 is deposited around the gate stack. The hardmask layer 302 may be any appropriate hardmask material including, e.g., silicon nitride, and may be deposited by any appropriate process including, e.g., chemical vapor deposition (CVD), atomic layer deposition (ALD), physical vapor deposition (PVD), etc. After deposition, the nitride layer is planarized to the level of the top layer 206 using, e.g., chemical mechanical planarization (CMP). It should be understood that those having ordinary skill in the art will be able to select a planarizing slurry appropriate to the materials being used.

Referring now to FIG. 4, a step in forming stacked carbon-based FETs is shown. The hardmask layer 302 is patterned and etched using, e.g., an anisotropic etch such as RIE to expose source and drain regions 404 on either side of the gate stack, leaving a remaining portion of hardmask 402.

Referring now to FIG. 5, a step in forming stacked carbon-based FETs is shown. A sidewall spacer 502 is formed along the gate stack and the remaining hardmask 402. The gate dielectric layer 108 is etched in the source and drain regions 404, leaving a gate dielectric 504 as part of the gate stack.

Figure 6:
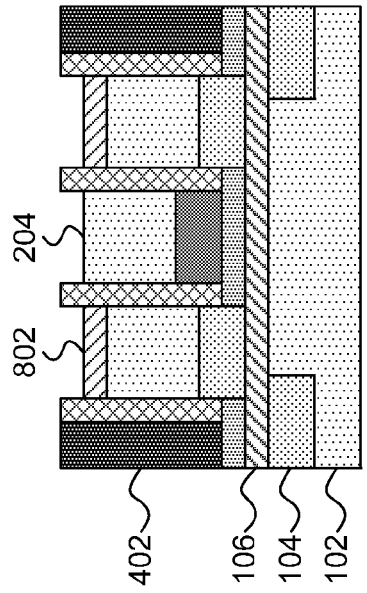
FIG. 6 is a cross-sectional view of a step in the formation of a stacked gate transistor in accordance with the present principles.

Referring now to FIG. 6, a step in forming stacked carbon-based FETs is shown. Source and drain material 602 is deposited in source and drain regions 404 and may include, e.g., an appropriate metal or conductive composite such as palladium. The source and drain regions may be deposited using, e.g., a PVD process followed by a wet etch to clean the sidewalls 502. An insulator 604 is then formed over the source/drain material 602 by any appropriate process. An exemplary material for insulator 604 is, e.g., silicon dioxide. The insulator 604 is then planarized using, e.g., a CMP that stops on the remaining hardmask 402.

Figure 7:
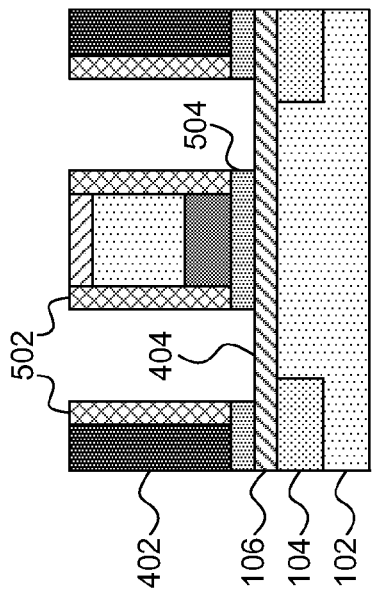
FIG. 7 is a cross-sectional view of a step in the formation of a stacked gate transistor in accordance with the present principles.

Referring now to FIG. 7, a step in forming stacked carbon-based FETs is shown. The insulator 604 is recessed above source/drain regions 602 using any appropriate etching process such as, e.g., a wet etch. The recesses are filled in with the same material as the top layer 206, forming top layer 702, and may include, e.g., amorphous silicon. The top layer 702 may be formed by CVD, ALD, PVD, or any other appropriate form of deposition and may then be planarized to the level of the original top layer 206 using, e.g., a CMP, that stops on the remaining hardmask 402.

Figure 8:
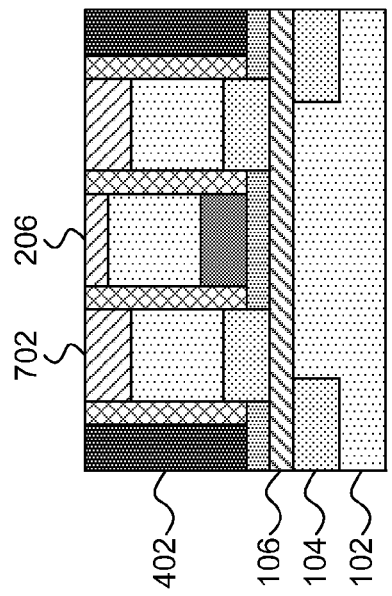
FIG. 8 is a cross-sectional view of a step in the formation of a stacked gate transistor in accordance with the present principles.

Referring now to FIG. 8, a step in forming stacked carbon-based FETs is shown. The top layers 206 and 702 are etched using, e.g., a timed RIE process. The etch is timed such that the top layer 206 over the gate stack is removed entirely, leaving a remaining top layer 802 over source and drain regions 602. The etch of top layer 206 exposes capping dielectric layer 204.

Referring now to FIG. 9, a step in forming stacked carbon-based FETs is shown. The capping dielectric layer 204 is removed using, e.g., a wet etch such as by diluted hydrofluoric acid. The removal of the dielectric cap 204 exposes the gate metal 202. The gate metal 202 will be referred to henceforth as lower gate 202 to distinguish it from the top gate to be formed.

Referring now to FIG. 10, a step in forming stacked carbon-based FETs is shown. A top gate metal 1002 is formed by depositing a gate material using any appropriate deposition process including, e.g., CVD, ALD, and PVD. The surface is machined down to at least the level of the remaining top layer 802 using, e.g., CMP. It is worth noting that no barrier is needed between the top gate metal 1002 and the lower gate metal 202. The materials of the two gates may be fabricated such that they have different work functions and will not interfere with one another in operation.

Referring now to FIG. 11, a step in forming stacked carbon-based FETs is shown. The remaining top layer 802 is etched further to produce recessed top layer 1104. The recessed top layer 1104 may be etched using, e.g., an appropriate wet etch. A top gate dielectric 1102 is deposited using, e.g., CVD, ALD, or PVD. The top gate dielectric 1102 may be formed from, e.g., a high-k dielectric such as hafnium silicate, hafnium dioxide, zirconium silicate, or zirconium dioxide.

Referring now to FIG. 12, a step in forming stacked carbon-based FETs is shown. The top gate dielectric 1102 is lithographically trimmed using, e.g., a resist 1202. The resist 1202 is patterned on top of the dielectric material 1102, and the dielectric material 1102 not covered by the resist 1202 is removed. Access 1204 to the top and bottom drain regions is provided by etching through the resist 1202, the top gate dielectric 1102, the remaining top layer 802, and the insulator 604.

Referring now to FIG. 13, a step in forming stacked carbon-based FETs is shown. The resist 1204 is stripped and a top carbon layer 1302 is placed on the top gate dielectric 1102. The top carbon layer 1302 may be formed from any suitable carbon-based channel material including, e.g., carbon nanotubes and graphene, and is patterned to fit an active area. A hardmask layer 1304 is formed over the top carbon layer 1302 by any appropriate deposition process including, e.g., CVD, ALD, or PVD. The hardmask layer 1304 may be formed from, e.g., an oxide such as silicon dioxide.

Referring now to FIG. 14, a step in forming stacked carbon-based FETs is shown. Bottom source and drain access holes 1402 are lithographically formed to provide access to source and drain extensions 104. A top source access hole 1404 is lithographically formed to provide access to the as yet unformed top source region and a top drain access hole is lithographically formed to provide access to the as yet unformed top drain region. In this particular embodiment, a drain access hole 1406 contacts both the upper and lower drain regions 604 and 602, essentially joining the two. As will be discussed below, this structure forms an inverter—different applications may connect different terminals.

Referring now to FIG. 15, a step in forming stacked carbon-based FETs is shown. The remaining top layer 802 of, e.g., amorphous silicon is removed using an appropriate wet etch such as ammonium hydroxide. The access holes 1402, 1404, and 1406 are filled with an appropriate contact metal such as, e.g., palladium. The contact metal is deposited using any appropriate deposition process such as, e.g., CVD or ALD and patterned to form bottom source contact 1502, top source contact 1504, top drain contact 1506, and bottom drain contact 1508. Electrical access to the gates 202/1002 is provided, but not shown in these figures as it is out of the plane of the drawing in this embodiment.

Embodiments of the present principles may be used to form a variety of different devices. For example, if the drains are shorted together as shown above, the lower source contact 1502 is connected to ground, and the upper source contact 1504 is connected to a supply voltage, an inverter is formed with the gates 202/1002 as input and the contact 1506 as output. Further electronic components may be formed, including for example a two-input NAND gate, a 2-1 multiplexer, and a 2-1 XOR gate, by connecting multiple such devices.

Figure 16:
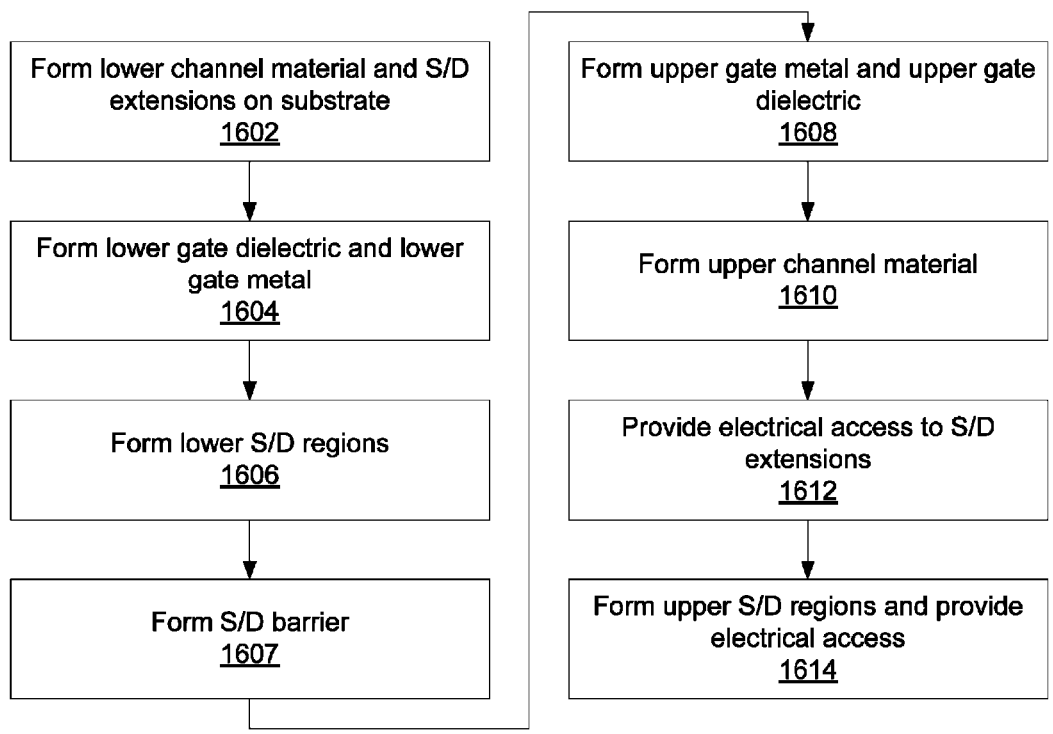
FIG. 16 is a block/flow diagram of a method for forming a stacked gate transistor in accordance with the present principles.

Referring now to FIG. 16, a process for forming stacked carbon-based FETs is shown. Block 1602 forms lower channel material 106 and source/drain extensions 104 on a substrate 102. As noted above, the lower channel material 106 is a carbon-based channel material that may include, for example, carbon nanotubes or graphene. The use of carbon-based channel material allows the creation of FET devices that are not formed from a single, monolithic crystal, such that devices may be stacked. The source/drain extensions 104 may be formed from any suitable material including, e.g., a conductor metal such as tungsten or a conductive composite.

Block 1604 forms the lower gate dielectric 504 and the lower gate 202. Source/drain regions 404 are etched out and lower source/drain material 602 is deposited in block 1606. Block 1607 forms an insulating barrier 604 above the source/drain material 602. This insulator 604 forms a barrier between the bottom of the source/drain region 404 and the top of the source/drain region 404, allowing for separate devices to be formed.

Block 1608 forms upper gate metal 1002 and upper gate dielectric 1102. Block 1610 forms an upper channel material 1302 over the upper gate dielectric 1102. As noted above, the upper channel material may be a carbon-based channel material such as carbon nanotubes or graphene. Block 1612 forms electrical access 1502/1508 to the source/drain extensions 104. Block 1614, meanwhile, forms the upper source and drain regions and provides electrical access 1504 and 1506 to them.

It should be recognized that the present principles may be adapted to an alternative embodiment that forms a carbon-based FET on top of a conventional, semiconductor channel MOSFET. Such structures may be used to form additional circuits such as NAND and XOR gates, static random access memory (SRAM) cells, and multiplexers. In such an embodiment, the bottom channel layer 106 may be formed from a semiconductor instead of a carbon material. The source/drain extensions 104 may then be formed from a heavily doped region of semiconductor.

Having described preferred embodiments of stacked carbon-based FETs and methods for making the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming stacked transistors, comprising:
   forming a lower channel layer on a substrate;
   forming a pair of vertically aligned gate regions over the lower channel layer;
   forming a pair of vertically aligned source regions and a pair of vertically aligned drain regions on the lower channel material, each pair separated by an insulator;
   forming an upper gate dielectric over the source regions, drain regions, and gate regions;
   forming an upper channel material over the upper gate dielectric; and
   providing electrical access to the source, drain, and gate regions.

2. The method of claim 1, wherein the upper and lower channel layers are carbon-based.

3. The method of claim 1, wherein the upper channel layer is carbon-based and the lower channel material is silicon based.

4. The method of claim 1, further comprising forming a lower gate dielectric layer on the lower channel layer.

5. The method of claim 1, wherein the step of forming a pair of vertically aligned gate regions comprises:
   forming a lower gate material on a lower gate dielectric layer; and
   forming an upper gate material on the lower gate material, wherein the upper gate material has a different work function than the lower gate material.

6. The method of claim 5, wherein the step of forming a pair of vertically aligned gate regions comprises:
   forming a capping layer on the lower gate material;
   etching the lower gate material and the capping layer to expose the lower gate dielectric layer outside of the gate regions to form a gate stack;
   forming spacers on sidewalls of the gate stack; and
   removing the remaining capping layer.

7. The method of claim 1, wherein the steps of forming a pair of vertically aligned source and drain regions comprises:
   forming lower source and drain extensions in the substrate before forming the lower channel layer;
   forming lower source and drain regions on the channel layer in electrical contact with the respective lower source and drain extensions;
   forming source and drain insulators on the respective lower source and drain regions; and
   forming upper source and drain regions on the respective source and drain insulators.

8. The method of claim 1, further comprising forming an electrical connection between at least two of the upper and lower source and drain regions.

9. The method of claim 8, wherein the electrical connection forms the stacked transistors into a device selected from the group consisting of a NAND gate, an XOR gate, a static random access memory cell, and a multiplexer.

10. A method for forming stacked transistors, comprising:
    forming a lower carbon-based channel layer on a substrate;
    forming a lower gate dielectric layer on the lower channel layer;
    forming a pair of vertically aligned gate regions on the lower gate dielectric layer;
    forming a pair of vertically aligned source regions and a pair of vertically aligned drain regions on the lower channel material, each pair separated by an insulator;
    forming an upper gate dielectric over the source regions, drain regions, and gate regions;
    forming an upper carbon-based channel material on the upper gate dielectric; and
    providing electrical access to the source, drain, and gate regions, including forming an electrical connection between at least two of the upper and lower source and drain regions.

11. The method of claim 10, wherein the steps of forming a pair of vertically aligned source and drain regions comprises:
    forming lower source and drain extensions in the substrate before forming the lower channel layer;
    forming lower source and drain regions on the channel layer in electrical contact with the respective lower source and drain extensions;
    forming source and drain insulators on the respective lower source and drain regions; and
    forming upper source and drain regions on the respective source and drain insulators.

12. The method of claim 10, further comprising forming an electrical connection between at least two of the upper and lower source and drain regions to form the stacked transistors into a device selected from the group consisting of a NAND gate, an XOR gate, a static random access memory cell, and a multiplexer.

13. A method for forming stacked transistors, comprising:
    forming a lower channel layer on a substrate;
    forming a pair of vertically aligned gate regions over the lower channel layer, comprising:
       forming a lower gate material on a lower gate dielectric layer;
       forming a capping layer on the lower gate material;
       etching the lower gate material and the capping layer to expose the lower gate dielectric layer outside of the gate regions to form a gate stack;
       forming spacers on sidewalls of the gate stack;
       removing the remaining capping layer; and
       forming an upper gate material on the lower gate material, wherein the upper gate material has a different work function than the lower gate material;
    forming a pair of vertically aligned source regions and a pair of vertically aligned drain regions on the lower channel material, each pair separated by an insulator;
    forming an upper channel material over the source regions, drain regions, and gate regions; and
    providing electrical access to the source, drain, and gate regions.

14. The method of claim 13, wherein the upper and lower channel layers are carbon-based.

15. The method of claim 13, wherein the steps of forming a pair of vertically aligned source and drain regions comprises:

forming lower source and drain extensions in the substrate before forming the lower channel layer;

forming lower source and drain regions on the channel layer in electrical contact with the respective lower source and drain extensions;

forming source and drain insulators on the respective lower source and drain regions; and forming upper source and drain regions on the respective source and drain insulators.

16. The method of claim 13, further comprising forming an electrical connection between at least two of the upper and lower source and drain regions to form the stacked transistors into a device selected from the group consisting of a NAND gate, an XOR gate, a static random access memory cell, and a multiplexer.

17. A method for forming stacked transistors, comprising:
forming a lower channel layer on a substrate;
forming a pair of vertically aligned gate regions over the lower channel layer;
forming a pair of vertically aligned source regions and a pair of vertically aligned drain regions on the lower channel material, each pair separated by an insulator, comprising:
   forming lower source and drain extensions in the substrate before forming the lower channel layer;
   forming lower source and drain regions on the channel layer in electrical contact with the respective lower source and drain extensions;
   forming source and drain insulators on the respective lower source and drain regions; and
   forming upper source and drain regions on the respective source and drain insulators;
forming an upper channel material over the source regions, drain regions, and gate regions; and
providing electrical access to the source, drain, and gate regions.

18. The method of claim 17, wherein the upper and lower channel layers are carbon-based.

19. The method of claim 17, wherein the step of forming a pair of vertically aligned gate regions comprises:
forming a lower gate material on a lower gate dielectric layer;
forming a capping layer on the lower gate material;
etching the lower gate material and the capping layer to expose the lower gate dielectric layer outside of the gate regions to form a gate stack;
forming spacers on sidewalls of the gate stack; and
removing the remaining capping layer; and
forming an upper gate material on the lower gate material, wherein the upper gate material has a different work function than the lower gate material.

20. The method of claim 17, further comprising forming an electrical connection between at least two of the upper and lower source and drain regions to form the stacked transistors into a device selected from the group consisting of a NAND gate, an XOR gate, a static random access memory cell, and a multiplexer.

* * * * *